(12) United States Patent
Box et al.

(10) Patent No.: US 7,106,416 B2
(45) Date of Patent: Sep. 12, 2006

(54) LITHOGRAPHIC APPARATUS AND DEVICE MANUFACTURING METHOD

(75) Inventors: Wilhelmus Josephus Box, Eksel (BE); Noud Jan Gilissen, Eindhoven (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/731,428

(22) Filed: Dec. 10, 2003

(65) Prior Publication Data

US 2005/0128448 A1 Jun. 16, 2005

(51) Int. Cl.
*G03B 27/42* (2006.01)
*G03B 27/58* (2006.01)

(52) U.S. Cl. .......................... 355/53; 355/72
(58) Field of Classification Search .......... 355/53, 355/72–76; 310/10, 12; 378/34, 35; 361/234
See application file for complete search history.

(56) References Cited

U.S. PATENT DOCUMENTS

| | | | |
|---|---|---|---|
| 5,220,171 A * | 6/1993 | Hara et al. ............... 250/443.1 |
| 5,413,167 A | 5/1995 | Hara et al. |
| 5,685,363 A * | 11/1997 | Orihira et al. ................ 165/46 |
| 6,019,164 A * | 2/2000 | Getchel et al. ............ 165/80.1 |
| 6,215,642 B1 | 4/2001 | Sogard |
| 6,353,271 B1 * | 3/2002 | Williams ...................... 310/12 |
| 6,605,955 B1 * | 8/2003 | Costello et al. ............. 324/760 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus including an illumination system for providing a beam of radiation and a support structure for supporting a patterning device. The patterning device serving to impart the beam with a pattern in its cross-section. The apparatus also having a substrate table for holding a substrate and a projection system for projecting the patterned beam onto a target portion of the substrate. The lithographic apparatus further having a chuck for supporting an object and a frame which supports the chuck with respect to other parts of the lithographic apparatus. The chuck is thermally isolated from at least the frame.

15 Claims, 3 Drawing Sheets

LITHOGRAPHIC APPARATUS AND DEVICE MANUFACTURING METHOD

FIELD OF THE INVENTION

The present invention relates to a lithographic apparatus and a device manufacturing method.

RELATED ART

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In most known lithographic apparatuses, during operations the substrate and/or patterning device (e.g., a mask or reticle) are clamped on a chuck, for example using electrostatic or vacuum forces, inter alia to retain the flatness of the clamped object. The chuck in turn is supported by a frame with respect to other parts of the lithographic apparatus.

However, during the lithographic process, the chuck may change in temperature, due to heat transferred from the substrate, for example. The change in temperature affects the accuracy of the projection of the pattern on the substrate. Even small changes in temperature (e.g., changes smaller than 0.05 K), and in particular thermal inhomogenities of the chuck, give use to (local) thermal expansions or shrinkage of the chuck which is in the order of the required precision of the projection, typically in the range of 1 micron to several nanometers.

From U.S. Pat. No. 5,413,167, a wafer holding block is known, which comprises a wafer chuck. The wafer chuck is formed with crossing grooves communicated with a vacuum pump, for vacuum attraction of a wafer. The wafer chuck is fixed on a fine motion stage, for fine alignment of the wafer to a mask. The fine motion stage is provided on a central portion of a support table which is fixed on a rough motion stage for rough alignment of the wafer to the mask. The wafer chuck is made of an aluminum material with a high thermal conductivity. A heat exchanger having therein a passageway coupled with two cooling water pipes is fixedly provided on the rough motion stage. Two flexible heat pipes are used to provide heat transmission between the wafer chuck and the heat exchanger. When operated, heat is transported from the wafer chuck to the heat exchanger via the flexible heat pipes. Accordingly, the temperature of the wafer chuck is controlled and deformation of the chuck is reduced.

U.S. Pat. No. 6,215,642 describes a vacuum compatible deformable electrostatic chuck. The chuck has a high thermal conductivity. The chuck includes a membrane having a layer of dielectric material, a layer of metallic film and a layer of semiconductor material. Struts and a rim are formed on the layer of semiconductor material. The rim is formed on the periphery of the layer of semiconductor material. The rim and struts contact a surface of a supporting structure and form a hollow area in which a coolant gas may be circulated. The supporting structure has gas manifold holes to connect the hollow area with a source of coolant gas. Via the coolant gas heat can be transferred away from the chuck.

U.S. Pat. No. 5,220,171 describes a wafer holding block, which comprises a wafer chuck. The wafer chuck is formed with crossing grooves communicated with a vacuum pump, for vacuum attraction of a wafer. The wafer chuck is fixed on a fine motion stage, for fine alignment of the wafer to a mask. The fine motion stage is provided on a central portion of a support table which is fixed on a rough motion stage for rough alignment of the wafer to the mask. The wafer chuck is made of an aluminum material with a high thermal conductivity. The chuck has a reduced pressure inside space. A wick wetted with an operative liquid is adhered to the inside wall of the space. A cooling plate with cooling water passageways is interposed between the fine-motion stage and the wafer chuck. By circulation of cooling water through the cooling plate, heat can be transferred away from the chuck and the cooling surface of the wafer chuck can be maintained at a temperature of about 20 degrees Celsius.

However, a drawback of the chucks known from this prior art documents is that, despite the respective device for transferring heat away from the chuck, thermal conditioning of the chuck is difficult. This is especially disadvantageous in view of current and expected trends in the accuracy requirements due to the decreasing dimensions of the structures to be formed onto the substrate.

SUMMARY

It is an aspect of the present invention to provide a lithographic apparatus with an increased accuracy. More specific, it is a goal of the invention, to provide a lithographic apparatus in which the chuck is thermally well conditioned.

According to an aspect of the invention, there is provided a lithographic apparatus comprising:

an illumination system constructed to provide a beam of radiation;

a support structure constructed to support a patterning device, said patterning device serving to impart a cross-section of said beam with a pattern to form a patterned beam;

a substrate table for holding a substrate; and a projection system that projects said patterned beam onto a target portion of said substrate, wherein at least one of said support structure and said substrate table includes a chuck and a frame that supports said chuck with respect to other parts of said lithographic apparatus, and said chuck being thermally isolated from at least said frame.

Because the chuck is thermally isolated, the chuck will absorb substantially no heat from at least the frame. Hence, the chuck will not change in temperature due to a heat exchange with the frame. Therefore, the chuck is thermally well conditioned.

In an embodiment of the invention, at least between the chuck and the frame a vacuum space is present. Thereby, the thermal conditioning of the chuck is improved, because transfer of heat between the chuck and at least the frame by heat conduction and/or convection is substantially inhibited, and a significant contribution to the overall heat transfer is reduced.

In an embodiment of the invention, at least a part of a surface of the chuck directed towards the frame has a low emissivity, for example when at least partially covered with a low emissivity coating, such as a coating containing chrome or silver. Thereby, the thermal conditioning of the chuck is improved, because transfer of heat between the chuck and at least the frame by heat radiation is substantially inhibited. This embodiment is especially suited for, but not limited to, application in a lithographic apparatus using electromagnetic radiation in the EUV range. Most EUV lithographic apparatus are operated in vacuum, and heat transfer via conduction and/or convection of gaseous media is (substantially) excluded. Accordingly, in EUV lithographic apparatuses radiation contributes significantly to the overall heat transfer.

In an embodiment of the invention, the chuck comprises a heat buffer system. Thereby, absorption of heat by the heat buffer system, for instance transferred from the object to the chuck, causes a smaller increase in temperature of the chuck than in a chuck without heat buffer system. Accordingly, thermal deformation of the chuck, and the object supported by the chuck, is reduced.

In an embodiment of the invention, the heat buffer system is a passive heat buffer system, i.e., the heat buffer is not connected to an active cooling system which transfers heat from the heat buffer system further away from the chuck. Thereby, vibrations and distortions of chuck position are reduced because no fluid is flowing for transferring heat away from or towards the chuck to maintain the chuck temperature. Such a heat buffer may also be used in other types of chucks, i.e., a chuck which is not thermally isolated.

In an embodiment of the invention, the low emissivity coating has an emissivity below 0.1, such as below 0.05. Accordingly, the chuck will emit only a small amount of radiation, and because a low emissivity entails a high reflectivity, absorb only a small amount of radiation. Accordingly, such an emissivity effectively limits the transfer of heat by radiation. A low emissivity can be obtained without complex measures, for instance by coating the chuck with a chrome or silver coating.

In an embodiment of the invention, the chuck at least reflects electromagnetic radiation in the infrared range. Thereby substantially no heat is absorbed by the chuck, because in a lithographic apparatus most of the heat transferred by radiation is emitted in the infrared range. Accordingly the chuck is thermally well-conditioned.

In an embodiment of the invention, the lithographic apparatus comprises a heat transfer device operable between the chuck and the object to be supported by the chuck, for transferring heat from the object to the chuck or vice versa, such as a gas supply system having at least one gas outlet near an object support surface of the chuck, for supplying a backfill gas between the chuck and the object. Thereby, heat can be transferred from the object to the chuck or vice versa, and accordingly the object is thermally well-conditioned.

According to an aspect of the invention, a method of manufacturing a device is provided, comprising:
  providing a substrate;
  providing a beam of radiation using an illumination system;
  using a patterning device to impart the beam of radiation with a pattern in its cross-section;
  supporting one of the substrate and the patterning device with a chuck;
  supporting the chuck with respect to other parts of the lithographic apparatus with a frame;
  thermally isolating the chuck from the frame; and
  projecting the patterned beam of radiation onto a target portion of the substrate.

As the chuck is thermally isolated, the chuck will absorb hardly any heat from its environment, such as the frame for example. Hence, the chuck will not fully warm up and is thermally well conditioned.

According to another aspect of the invention, a chuck for use in a lithographic device is provided which comprises:
  a first side having a support surface constructed to support an object;
  a second side having a low emissivity coating to thermally isolate said chuck;
  an enclosed chamber positioned within said chuck; and
  a phase transiting material positioned within said enclosed chamber.

According to another aspect of the invention, a lithographic apparatus is provided which comprises:
  means for providing a beam of radiation;
  means for forming a patterned beam;
  means for supporting said means for forming a patterned beam;
  a substrate;
  means for holding said substrate; and
  means for projecting the patterned beam onto a target portion of said substrate, one of said means for forming said patterned beam and said means for holding a substrate including means for thermally isolating one of said means for forming said patterned beam and said substrate from other parts of said lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
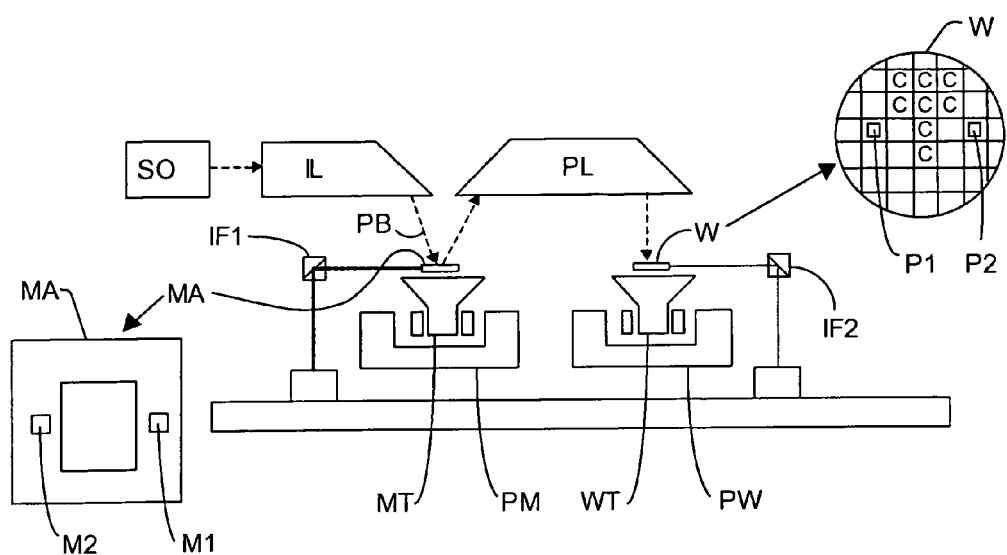
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV or EUV radiation).

a first support structure (e.g. a mask table) MT for supporting patterning device (e.g. a mask) MA and connected to first positioning device PM for accurately positioning the patterning device with respect to item PL;

a substrate table (e.g. a wafer table) WT for holding a substrate (e.g. a resist-coated wafer) W and connected to second positioning device PW for accurately positioning the substrate with respect to item PL; and a projection system (e.g. a reflective projection lens) PL for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the magnification, demagnification, and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
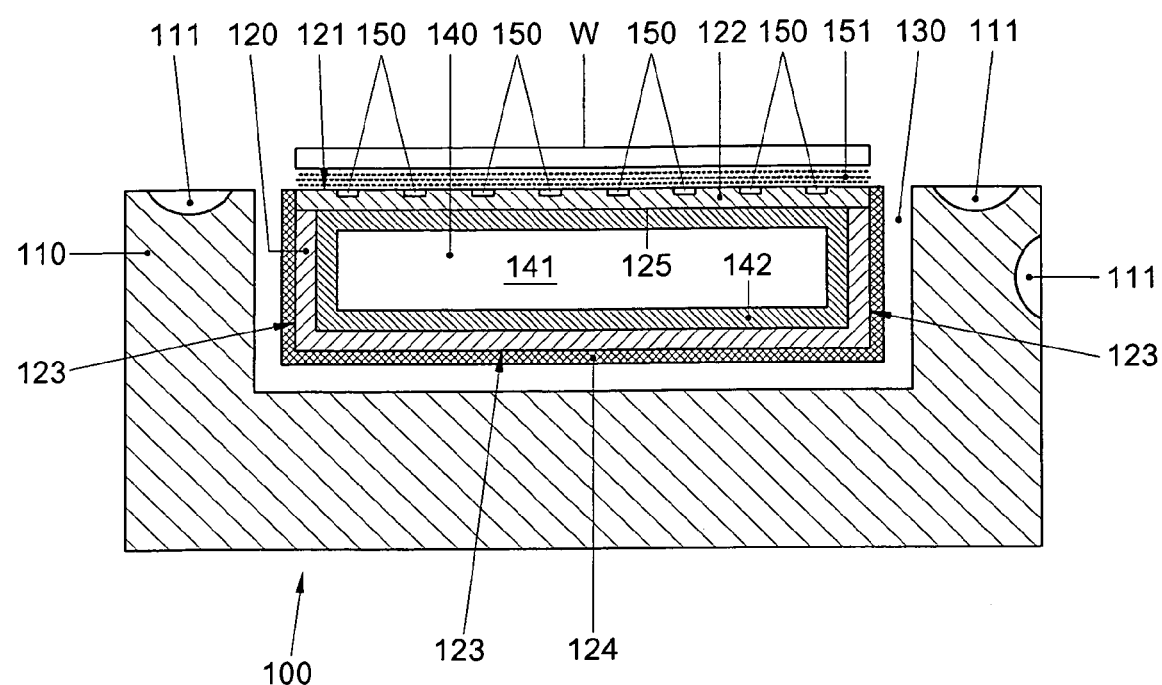
FIG. 2 schematically shows a cross-sectional view of an example of an embodiment of a chuck and a frame according to the invention.

FIG. 2 shows an example of a structure 100, which may for example be implemented as a substrate table WT, or a part thereof, for the substrate W in the example of a lithographic apparatus shown in FIG. 1. From hereon the structure 100 is referred to as the object table 100.

The object table 100 comprises a frame 110 on which a chuck 120 is mounted. The frame 110 may be provided with measurement devices. For instance, mirrors 111 are provided at different sides of the frame 110, which can be used in interferometric position determination systems. The frame 110 can be mounted on the short-stroke module or other positioning device, and can be positioned by this module relative to other parts of the lithographic apparatus.

The chuck 120 has a support surface 121 on which an object supported by the chuck, for instance, may also be the patterning device H of the lithographic apparatus shown in FIG. 1. The substrate W is clamped onto the chuck 120 by an electrostatic clamping system (not shown) which uses electrostatic forces to clamp the substrate W against the chuck 120. Such a clamping system is known per se and for sake of brevity not described in further detail. It should, however, be noted that any clamping system suitable for the specific implementation may also be used, such as a clamping system using vacuum forces or otherwise.

The chuck 120 is thermally isolated from the frame 110. In this example, to that end, a space 130 containing a vacuum is present between the frame 110 and the chuck 120. In operating conditions of the chuck 120, the pressure in the space or gap 130 is reduced to a selected level of vacuum, for instance by separately pumping the space 130 with a vacuum pump or reducing the pressure in the entire lithographic apparatus to the selected vacuum level. Because of the vacuum, transfer of heat from the frame 110 to the chuck 120 by conduction and/or convection of gaseous media in the space 130 is substantially inhibited, and heat will mainly be transferred by radiation.

The chuck 120 is further provided with a reflective surface, having a low emissivity, such as below 0.1, for example below 0.05. Because of the low emissivity, heat transfer from the chuck 120 to the frame 110 by radiation is inhibited. In the example of FIG. 2, the chuck 120 comprises a body 122 which is provided with a low-emissivity coating 124 on at least a part of a surface 123 facing the frame 110. The coating 124 may for example comprise a metal coating, such as a coating comprising chrome, or silver. However, the coating 124 may also comprise other materials and/or may comprise one or more coating layers. The chuck 120 may be provided with a reflective surface in any other suitable manner, for example by polishing at least a part of the surface 123 of the body 122 or otherwise.

It is also possible to provide the frame 110 instead of the chuck 120 with a reflective surface to inhibit heat transfer via radiation between the chuck 120 and the frame 110, or to provide the frame 110 and the chuck 120 with a reflective surface.

It should be noted that the thermal isolation may also be implemented in a different manner than in the example of FIG. 2. For instance, a thermally insulating material may be present in the spacing 130 between the frame 110 and chuck 120 to inhibit transfer of heat. For example, a stationary gas, such as air, may be present in the spacing to provide the thermal insulation. The gas may also be an inert gas such as helium, neon, argon, or xenon or any other suitable gas.

Also, a heat shield with a low emissivity may be present between the chuck 120 and the frame 110 to inhibit heat transfer between the chuck 120 and the frame 110 or vice versa. Such a heat shield may for example be a passive heat shield or be conditioned actively, for example using a water cooling system by which absorbed heat can be discharged from the heat shield.

The chuck 120 further has a heat buffer system 140 which increases the heat capacity of the chuck 120. When heat is transferred to the chuck 120, the heat is at least partially absorbed by the heat buffer system 140. Because of this, the temperature of the chuck 120 rises less than without the heat buffer system 140. Accordingly thermal deformations of the chuck 120 are reduced.

In this example, the heat buffer 140 comprises a chamber 141 inside the body 122. A phase transiting material 142 is received in the chamber 141. When the chuck 120 receives thermal energy, at least part of the thermal energy will enter the chamber and be absorbed by the phase transiting material 142. When the phase transiting material 142 reaches its phase-transition temperature, for example the boiling temperature of a liquid, the thermal energy absorbed by the material 142 will be used for passing the phase transition, resulting in no or only a very small increase in temperature.

The heat buffer system 140 may also be implemented in a different manner than shown in FIG. 2. For instance, the buffer system 140 may comprise a chamber in the body 122 provided with a material having a higher heat capacity than the material the body 122 is made of. Also, the buffer system may be implemented by a chuck which has a solid body. It should be noted that a heat buffer system may also be applied to a chuck which is not thermally isolated, such as for instance in a chuck which is capable of exchanging heat with a frame via a conductive mechanism or otherwise.

In case a heat buffer system is used, the heat buffered in the system may be released if the chuck 120 does not absorb heat, but instead emits heat, e.g. when the chuck is warmer than its environment, for example in a time period between removing a finished substrate and positioning a following substrate. In such case, the temperature of the chuck remains more or less stable, because the heat buffer can release heat without a significant change of temperature. For instance when the heat buffer system comprises a phase-transiting material, heat can be released by going through the phase transition in the other direction without substantial changes in temperature.

The heat buffer may for example be part of an active heat control system, which for instance may comprise a closed circuit in which a cooling fluid, such as water or a gas, is circulated. Such a circuit may be thermally isolated from the frame 110 and other components in the environment of the chuck 120. Thereby, a heat buffer system with a large heat capacity can be obtained.

The heat buffer system 140 may be implemented as a passive system, i.e., a system which is not connected to further active heat draining devices, such as a cooling fluid system, which transfer heat from the heat buffer system 140 and exchange heat with the frame 110 or other components in the environment of the chuck 120. Thereby, vibrations and other distortions of the chuck position due to, for instance, flow of a cooling fluid can be reduced and, accordingly the accuracy of projecting the pattern onto the substrate is increased. However, depending on the specific implementation a cooling system for removing heat from the chuck may be provided, and optionally be connected to a heat buffer.

In the example of FIG. 2, the chuck 120 is provided with a thermally conducting element 125 having a high thermal conductivity. The thermally conducting element 125 enables an increase of the effective heat transfer rate between the surface 121 and the heat buffer system 140. In this way, the change in temperature of the body 122 of the chuck 120 is reduced, because heat is fed into the buffer system 140 before entering the body 122. The thermally conducting elements 125 may also extend through other parts of the chuck 120 to transfer heat for example from the chuck support surface to the longitudinal side of the chuck 120 facing the frame 110.

In the example of FIG. 2, in particular the change in temperature of the support surface 121 is reduced because the thermally conducting element 125 is placed between the side of the chuck 120 on which the substrate W is positioned and the heat buffer system 140. Accordingly, temperature change of the object positioned on the support surface 125 is reduced as well.

In the example of FIG. 2, the thermally conducting element 125 extends across at least a part of the support surface 121. Thus, in case of temperature differences between different parts of the support surface 121, a heat flow will occur, which is facilitated by the thermal conducting element 125, because the element 125 provides a thermal conducting path between those parts. Accordingly, differences in temperature along the support surface 121, and accordingly thermal inhomogenities in the substrate W are reduced. A thermal conducting support surface may also be obtained in a different manner, for example by providing at the support surface 125 a chamber filled with a thermally conducting material. Such a chamber may then also operate as a heat buffer.

However, the support surface 121 may alternatively be made of a material with a low thermal conductivity. In such case, all objects positioned on the support surface during operation of the lithographic apparatus will obtain the same thermal pattern, i.e. the objects will have substantially the same temperature distribution.

The object and the chuck 120 can be thermally isolated from each other, for example by providing a low emissivity coating at the support surface 121. In such case, the object is not thermally affected by heat transfer between the chuck 120 and the object during operation of the lithographic apparatus.

However, the object and chuck may alternatively be thermally connected to each other. In FIG. 2, for example, the chuck 120 is further provided with a backfill gas system 150 at the chuck support surface 121. If an object is present at the chuck support surface 121, a backfill gas 151, such as nitrogen or argon, can be introduced in a spacing between the object (e.g. substrate or mask) and the chuck 120. Via the backfill gas 151, the effective heat transfer rate from the object to the chuck 120 can be increased by conduction and/or convection in the backfill gas. The backfill gas 151 enables an increase of the effective heat transfer rate between the object, e.g. substrate W, and the object support surface 121. In this way, thermal distortions acting on the object, such as deformations or otherwise are reduced.

Figure 3:
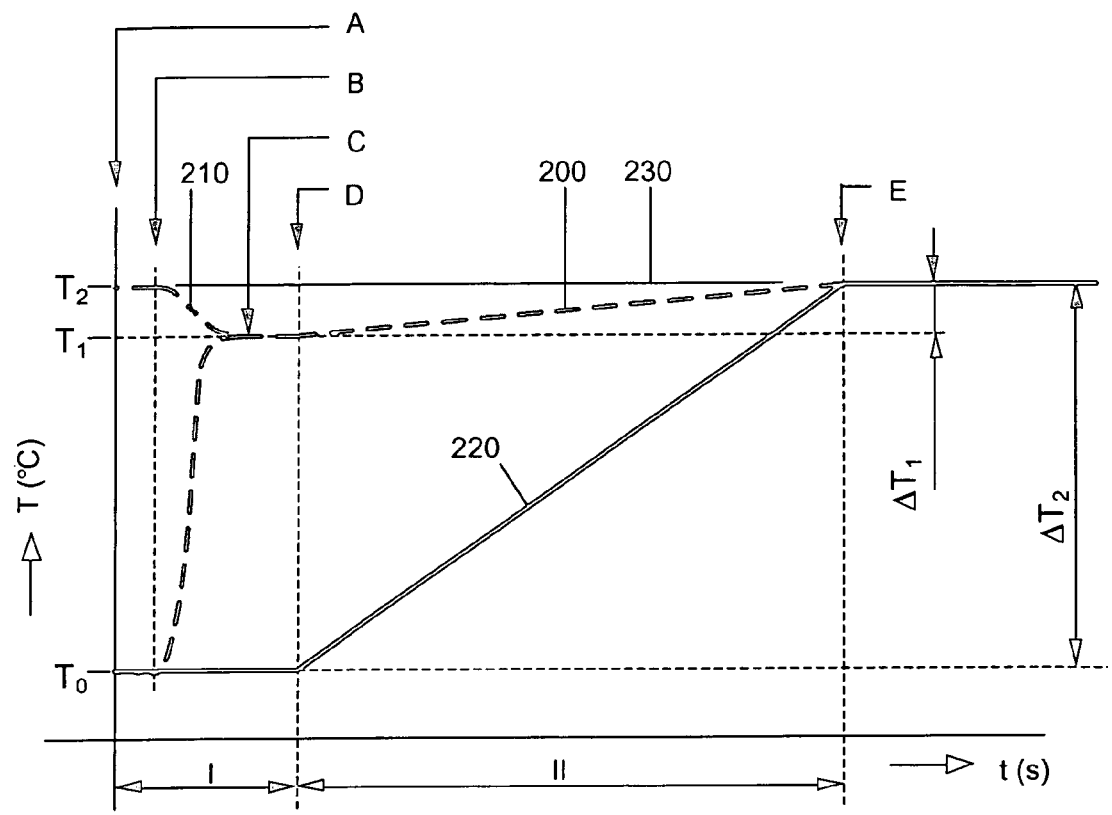
FIG. 3 schematically shows a graph of the simulated temperature of a chuck and/or substrate as a function of time, for different examples of embodiments of a chuck according to the invention.

FIG. 3 schematically shows the results of a simulation of the temperature of the chuck 120 and the substrate W in the case of a thermal connection between both and the case of a thermally isolated substrate. In FIG. 3 the dashed line 200 represents the temperature of the substrate W in case it is thermally connected to the chuck 120, dash-dotted line 210 represents the temperature of the chuck 120 in this case, solid line 220 represents the temperature of a substrate W thermally isolated from the chuck 120, and solid line 230 represents the temperature of the chuck 120 in the latter case.

At a moment A in time, the substrate W is loaded onto the chuck 120. As shown, for both cases the substrate W then has a temperature $T_0$. At moment B in time, a backfill gas is introduced between the chuck 120 and the substrate W for the thermally connected case. At moment D in time, projecting the radiation beam onto the substrate W is initiated, and terminated at moment E in time. The time period I between moments A and D is referred to as the metrology phase, while the time period II between moments D and E is referred to as the exposure phase.

As can be seen in FIG. 3, for the thermally isolated case, the temperature of the chuck 120 and the substrate W remain substantially constant during the metrology phase I. For the thermally connected case, due to the heat exchange, the temperature the chuck 120 and the substrate W becomes equal, after introduction of the backfill gas, resulting in a similar temperature $T_1$ of the chuck 120 and the substrate W. At the moment C in time when the temperature is leveled, a fine alignment of the chuck 120 is performed, using the short-stroke module mentioned above.

During the exposure phase II, the substrate W absorbs energy from the received radiation and heats up. For the case of the isolated chuck 120 and substrate W, the temperature of the chuck 120 remains substantially constant because there is no heat exchange between the chuck 120 and the substrate W. However, the temperature of the substrate W increases with $\Delta T_2$, from $T_0$ to $T_2$, during the exposure phase. For the thermally connected case, due to the heat exchange, the chuck 120 and the substrate W are warmed substantially similarly, with $\Delta T_1$, from $T_1$ to $T_2$.

As can be seen in FIG. 3, for the thermally isolated case the increase $\Delta T_2$ of the substrate temperature is larger than the increase $\Delta T_1$ after fine alignment for the thermally connected substrate. Thus, for the thermally connected case, after moment C, the substrate W is less susceptible to thermal effects, such as thermal deformation than for the isolated case. Accordingly, the accuracy of projection is increased for the thermally connected substrate. However, for the thermally disconnected case, the chuck 120 remains substantially constant in temperature, and accordingly experiences no or almost no thermal deformation.

It should be apparent that the invention is not limited to the example described above, and various modifications are conceivable. For instance, the chuck may be provided with heat conductors by which heat can be transferred from the support surface 121 to the other sides of the chuck. Such heat conductors may for example be metallic or other thermally conducting bars, strips or otherwise extending from the support surface 121 to the respective side through the body 122. Such a heat conducting mechanism may also be implemented by manufacturing the body 122 from a thermally conducting, zero expansion material or otherwise.

However, other modifications are also possible, such as for example the wavelength of electromagnetic radiation in which the coating 124 reflects radiation. For instance, in most lithographic apparatuses the chuck and/or other parts thereof radiate most heat as electromagnetic radiation in the infrared frequency range. Accordingly, a chuck provided with a surface reflecting electromagnetic radiation in the infrared range exhibits a good thermal isolation.

While specific embodiments of the invention have been described above, it will be appreciated that the invention may be practiced otherwise than as described. The description is not intended to limit the invention.

The invention claimed is:

1. A lithographic apparatus comprising:
   an illumination system constructed to provide a beam of radiation;
   a support structure constructed to support a patterning device, said patterning device serving to impart a cross-section of said beam with a pattern to form a patterned beam;
   a substrate table for holding a substrate; and
   a projection system that projects said patterned beam onto a target portion of said substrate, wherein at least one of said support structure and said substrate table includes a chuck and a frame that supports said chuck with respect to other parts of said lithographic apparatus, said chuck being thermally isolated from at least said frame, and wherein said frame is provided with at least one mirror on a side and said apparatus is provided with an interferometric position determination system for accurately positioning the patterning device or the substrate with the aid of said mirror.

2. A lithographic apparatus according to claim 1, further comprising:
   a vacuum space positioned between said chuck and said frame.

3. A lithographic apparatus according to claim 1, wherein said chuck and said frame are completely separated and spaced from each other by a gap.

4. A lithographic apparatus according to claim 1, wherein at least one of said support structure and said substrate table is said substrate table and said chuck supports said substrate.

5. A lithographic apparatus according to claim 1, wherein at least one of a part of a surface of said chuck directed towards said frame and a part of a surface of said frame directed towards said chuck has a low emissivity.

6. A lithographic apparatus according to claim 5, wherein said at least one of a part of a surface of said chuck directed towards said frame and a part of a surface of said frame directed towards said chuck is covered with a low emissivity coating.

7. A lithographic apparatus according to claim 6, wherein said coating contains chrome or silver.

8. A lithographic apparatus according to claim 6, wherein said low emissivity coating has an emissivity below 0.1.

9. A lithographic apparatus according to claim 1, wherein said chuck includes a heat buffer system.

10. A lithographic apparatus according to claim 9, wherein
    said heat buffer system is structured as a passive heat buffer system.

11. A lithographic apparatus according to claim 1, wherein one of said chuck and said frame are structured to reflect electromagnetic radiation in the infrared range.

12. A lithographic apparatus according to claim 1 further comprising:
    a heat transfer device operable between said chuck and an object supported by said chuck to transfer heat between said object and said chuck.

13. A lithographic apparatus according to claim 12, wherein
    said heat transfer device comprises a gas supply system to supply a backfill gas between said chuck and said object, said heat transfer device including a gas outlet positioned adjacent an object support surface of said chuck.

14. A method of manufacturing a device, comprising:
    providing a substrate;
    providing a beam of radiation using an illumination system;
    using a patterning device to impart the beam of radiation with a pattern in its cross-section;
    supporting one of the substrate and the patterning device with a chuck;
    supporting the chuck with respect to other parts of the lithographic apparatus with a frame, said frame being provided with at least one mirror on a side;
    thermally isolating the chuck from the frame;
    accurately positioning the patterning device or the substrate with an interferometric position determination system and the mirror; and
    projecting the patterned beam of radiation onto a target portion of the substrate.

15. A chuck for use in a lithographic device, comprising:
    a first side having a support surface constructed to support an object;
    a second side having a low emissivity coating to thermally isolate said chuck;
    an enclosed chamber positioned within said chuck; and
    a phase transiting material positioned within said enclosed chamber.

* * * * *